US012727080B2

(12) United States Patent
Hirose et al.

(10) Patent No.: US 12,727,080 B2
(45) Date of Patent: Sep. 1, 2026

(54) GLASS CLOTH, PREPREG, AND PRINTED WIRING BOARD

(71) Applicant: ASAHI KASEI KABUSHIKI KAISHA, Tokyo (JP)

(72) Inventors: Amane Hirose, Tokyo (JP); Yuka Hashimoto, Tokyo (JP)

(73) Assignee: ASAHI KASEI KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 18/838,818

(22) PCT Filed: Mar. 7, 2023

(86) PCT No.: PCT/JP2023/008609

§ 371 (c)(1),
(2) Date: Aug. 15, 2024

(87) PCT Pub. No.: WO2023/171674

PCT Pub. Date: Sep. 14, 2023

(65) Prior Publication Data

US 2025/0234457 A1 Jul. 17, 2025

(30) Foreign Application Priority Data

Mar. 8, 2022 (JP) ................................ 2022-035616

(51) Int. Cl.
*H05K 1/03* (2006.01)
*D03D 15/267* (2021.01)
*D03D 15/573* (2021.01)

(52) U.S. Cl.
CPC ......... *H05K 1/0366* (2013.01); *D03D 15/267* (2021.01); *D03D 15/573* (2021.01); *D10B 2505/02* (2013.01); *H05K 2201/029* (2013.01)

(58) Field of Classification Search
CPC .................................................. D03D 15/267
See application file for complete search history.

(56) References Cited

U.S. PATENT DOCUMENTS

2018/0305846 A1 10/2018 Tachibana et al.
2020/0247972 A1 8/2020 Sato et al.
2020/0270411 A1 8/2020 Kital et al.
2021/0310161 A1 10/2021 Suzuki
2021/0395929 A1 12/2021 Shiobara et al.
2024/0121894 A1 4/2024 Hirose et al.
2024/0132684 A1 4/2024 Hirose et al.

FOREIGN PATENT DOCUMENTS

CN 102817226 A 12/2012
JP 49-80394 A 8/1974
JP 59-130365 A 7/1984
JP 4-50359 A 2/1992
JP 6-166952 A 6/1994
JP 7-279055 A 10/1995
JP 11-302968 A 11/1999
JP 2001-73253 A 3/2001
JP 2003-96659 A 4/2003
JP 2003-176156 A 6/2003
JP 2005-42245 A 2/2005
JP 2016-108162 A 6/2016
JP 2016-113322 A 6/2016
JP 2018-127747 A 8/2018
JP 6570780 B1 9/2019
JP 2020-105683 A 7/2020
JP 2020-194888 A 12/2020
JP 2021-63320 A 4/2021
JP 2021-88488 A 6/2021
JP 2021-195689 A 12/2021
JP 7015972 B1 2/2022
JP 7015973 B1 2/2022
JP 7429826 B1 2/2024
WO WO 2019/065940 A1 4/2019
WO WO 2019/065941 A1 4/2019

OTHER PUBLICATIONS

Supplementary European Search Report for European Application No. 23766850.4, dated May 15, 2025.
International Search Report for International Application No. PCT/JP2023/008609, dated Jun. 6, 2023, with an English translation.
Japanese Office Action for Japanese Application No. 2024-008207, dated Sep. 3, 2024.
Written Opinion of the International Searching Authority for International Application No. PCT/JP2023/008609, dated Jun. 6, 2023, with an English translation.

*Primary Examiner* — Ian A Rummel
(74) *Attorney, Agent, or Firm* — Birch, Stewart, Kolasch & Birch, LLP

(57) ABSTRACT

The present disclosure relates to a glass cloth, prepreg, and printed circuit board.
There is provided a glass cloth including woven glass yarns each containing a plurality of filaments, wherein
a bulk dissipation factor of a glass in the glass yarns is 0.0010 or less,
a tensile strength of warp yarns per thickness of the glass cloth as represented by the following formula (A) is in the range of 0.50 to 6.0:

warp direction tensile strength (N/25 mm) of the glass cloth/thickness of the glass cloth (μm) (A), a coefficient of variation of the warp direction tensile strength of the glass cloth is in the range of 15% or less, and
a dissipation factor of the glass cloth at 10 GHz is in the range of greater than 0 and 0.0010 or less.

20 Claims, No Drawings

GLASS CLOTH, PREPREG, AND PRINTED WIRING BOARD

FIELD

The present invention relates to a glass cloth, a prepreg, and a printed circuit board.

BACKGROUND

Currently, the performance of information terminals such as smartphones is increasing, and high-speed communication as exemplified by 5G communication is progressing. In accordance with such a situation, in particular, for printed circuit boards for high-speed communication, it is desired not only to improve the heat resistance, which has been conventionally required, but also to further improve the dielectric properties of the insulating materials (for example, reducing the dissipation factor). Similarly, there is a situation where it is desired to improve the dielectric properties of a prepreg used as an insulating material for printed circuit boards, as well as the glass yarns and glass cloth contained in the prepreg.

In order to lower the dielectric constant of an insulating material, a technique of constructing the insulating material using a prepreg of a glass cloth impregnated with a low-dielectric resin (hereinafter referred to as "matrix resin") is known (Patent Literature 1 and 2). Patent Literature 1 and 2 describe that a polyphenylene ether terminally-modified with a vinyl group or methacryloxy group is advantageous in low-dielectric properties and heat resistance, and describe the use of this modified polyphenylene ether as a matrix resin.

Furthermore, in order to improve the dielectric properties of a prepreg, a technique of constructing the prepreg using a low-dielectric glass is also known (Patent Literature 3). In Patent Literature 3, glass yarns having a silicon dioxide ($SiO_2$) composition amount of 98% by mass to 100% by mass are used. Patent Literature 3 describes a technique of constructing a prepreg using a low-dielectric glass cloth which has been surface-treated with a silane coupling agent having an unsaturated double bond group and which meets various requirements such as a loss on ignition value of 0.12% by mass to 0.40% by mass.

It is reported that silanol groups present on the surface of glass cloth cause deterioration of dielectric properties (Patent Literature 4 and 5). Patent Literature 4 and 5 describe a technique of treating the surface of glass cloth with polysilazane to decrease the silanol groups present on the surface of glass cloth in order to improve dielectric properties. Patent Literature 6 and 7 describe that heat treatment reduces the dissipation factor of a silica glass cloth.

In general, a sizing agent containing starch as a main component is applied to the surface of glass yarns in order to, for example, suppress generation of fuzz and prevent water absorption in the glass yarns. Before, after, or during the weaving of the glass yarns, the glass yarns or glass cloth are washed for the purpose of decreasing the sizing agent (de-sizing).

Patent Literature 8 and 9 report that by using a sizing agent for quartz glass fibers containing ammonium nitrate or a sizing agent for quartz glass fibers in which at least a portion of a starch is esterified with nitric acid, heating de-oiling at a relatively low temperature is possible.

As printed circuit boards become more densely packed, the spaces between through-holes and/or between inner-layer lines and through-holes become narrower, and as a result, a phenomenon in which insulation resistance decreases has been observed, and printed circuit boards have been required to have higher reliability than before. The influence of copper migration (electrolytic corrosion) is thought to be one of the causes of reduction in the insulation resistance of printed circuit boards. Electrolytic corrosion is a phenomenon in which copper, which is a conductor, elutes and precipitates from the anode in a high-humidity environment where a voltage is applied, passes through the insulating material, and becomes conductive to the cathode. Electrolytic corrosion can be divided into dendrites, which occur in the surface resist and/or adhesive layer, and CAF (Conductive Anodic Filaments), which occur at the interface between the inner layer glass fiber and the resin. Ionic components at the interface between glass fiber and resin are known to be one of the causes of CAF. Patent Literature 10 describes that the CAF resistance of a printed circuit board is improved when the amount of alkali metals and/or alkaline earth metals extracted from a glass cloth having an E-glass composition is 20 ppm or less. Patent Literature 11 describes that by treating the surface of a glass cloth with a surface treatment agent containing a coupling agent as a primary component and then spraying a stream of water vapor, the amount of calcium ions adhering to the surface of glass cloth can be decreased, whereby CAF resistance is improved. Patent Literature 12 describes that CAF resistance can be improved by using a warp sizing agent based on polyvinyl alcohol and/or polyvinyl alcohol derivatives with an alkali metal compound content of 0.5% by weight or less.

CITATION LIST

Patent Literature

[PTL 1] WO 2019/065940
[PTL 2] WO 2019/065941
[PTL 3] Japanese Unexamined Patent Publication (Kokai) No. 2018-127747
[PTL 4] Japanese Unexamined Patent Publication (Kokai) No. 2020-194888
[PTL 5] Japanese Unexamined Patent Publication (Kokai) No. 2021-88488
[PTL 6] Japanese Unexamined Patent Publication (Kokai) No. 2021-63320
[PTL 7] Japanese Unexamined Patent Publication (Kokai) No. 2021-195689
[PTL 8] Japanese Unexamined Patent Publication (Kokai) No. 2016-108162
[PTL 9] Japanese Unexamined Patent Publication (Kokai) No. 2016-113322
[PTL 10] Japanese Unexamined Patent Publication (Kokai) No. 2001-73253
[PTL 11] Japanese Unexamined Patent Publication (Kokai) No. 2005-42245
[PTL 12] Japanese Unexamined Patent Publication (Kokai) No. 7-279055

SUMMARY

Technical Problem

However, Patent Literature 1 and 2 have room for consideration from the viewpoint of further improving dielectric properties. For example, Patent Literature 1 and 2 do not consider the use of a low-dielectric glass as described in Patent Literature 3. Patent Literature 3 describes that glasses having a $SiO_2$ composition amount of 98 to 100% by mass are problematic from a practical viewpoint, and thus, the provision of other techniques for suitably providing a glass cloth and a prepreg using this type of glass yarns has been awaited.

In the technique of decreasing silanol groups present on the surface of glass cloth as indicated in Patent Literature 4 and 5, the improvement in the dissipation factor of a silica glass cloth at 10 GHz is $1.0\times10^{-3}$ to $1.0\times10^{-4}$, and the improvement effect is considered to be small. From this, it is thought that there are causes other than the presence of hydroxyl groups on the glass surface that increase the dissipation factor of the glass cloth, and there is room for improvement. In the technique of reducing the dissipation factor by heat-treating the silica glass cloth at high temperatures as indicated in Patent Literature 6, there is a concern that the strength of the glass cloth may decrease due to excessive heat treatment. Glass cloths used for printed circuit boards are generally subjected to surface treatment processing with silane coupling agents or the like. In Patent Literature 6, the silica glass cloth is not subjected to surface treatment processing and therefore is not practical as a glass cloth for printed circuit boards, thus having room for improvement. Patent Literature 7 reports a technique of recovering the tensile strength of a glass cloth after high-temperature heat treatment by etching to remove a strained layer of quartz glass. However, since the high-temperature heat treatment causes a significant decrease in strength, there is a problem in that the glass cloth tends to "tear" during the strained layer removal step. In addition, the strained layer may not be sufficiently removed from areas where it is difficult for the etching solution to penetrate, such as the weaving intersections of the glass cloth and/or the twisted portions of the glass fibers. Thus, there is a problem in that the tensile strength of the glass cloth and/or the filament diameter of the glass fibers varies, whereby the glass cloth can easily become wrinkled, torn, or the like during transportation of the glass cloth. Furthermore, since the glass is melted by the etching treatment, a problem is considered in that the basis weight of the glass cloth is excessively reduced. It is necessary that the amount of matrix resin in the prepreg, referred to as the resin content, be precisely controlled. The etching treatment, which causes the variations in the basis weight of the glass cloth itself, makes it difficult to control the resin content in the prepreg. Thus, there is a strong need for a processing method which can suppress variations in the basis weight of the glass cloth and uniformly improve the tensile strength of the glass cloth.

As the strength of the glass cloth decreases, the tension control range during transportation of the glass cloth becomes extremely low and narrow, there is a concern that "wrinkling" and/or "scratching" may occur on the glass cloth due to contact with members during transportation. In order to suppress a decrease in strength of the glass cloth, Patent Literature 8 and 9 describe a technique of heating de-oiling a glass cloth at a relatively low temperature. However, in order to further improve the dielectric properties of glass cloths, there is a strong need to develop a technique which not only suppresses a decrease in the strength of a glass cloth but also reduces the dissipation factor of the glass cloth. As described above, there is a strong demand for a processing method which can reduce appearance defects such as tearing and wrinkling of the glass cloth.

Patent Literature 10, 11 and 12 describe techniques for decreasing alkali metals and/or alkaline earth metals in glass surfaces. Though there have been reports regarding alkali metals and/or alkaline earth metals and CAF resistance in the prior art, including Patent Literature 10, 11, and 12, there has still not been sufficient research from the perspective of maintaining the strength of the glass cloth. Though Patent Literature 8 and 9 describe that the presence of alkali metals causes a recrystallization phenomenon called devitrification of silica glass fibers to significantly reduce glass strength, there are no descriptions regarding the technique to be used to suppress the devitrification phenomenon. There is a strong need for technological development for glass cloths for printed circuit boards for high-speed communications from the perspective of reducing the dissipation factor of the glass cloth and suppressing a reduction in the strength of the glass cloth.

The present invention aims to provide a low dielectric glass cloth which has suppressed variations in basis weight, has excellent dielectric properties (for example, low dissipation factor), has less wrinkling and/or scratching, and is less prone to tearing, and to provide a prepreg containing this glass cloth. Another object of the present invention is to provide a printed circuit board, an integrated circuit, and an electronic device, with which yield can be improved by using this prepreg. Yet another object of the present invention is to provide a method for the production of a glass cloth for suitably obtaining the glass cloth described above.

Solution to Problem

The present inventors believe that clarifying the relationship between the strength of glass cloth and metal ions (including alkali metal ions and/or alkaline earth metal ions, etc.) is particularly meaningful from the viewpoint of industrial production of glass cloth. The present inventors have conceived the idea that by maintaining the strength of a quartz glass cloth, sufficient tension can be applied to the glass cloth, and by using this, it would become possible to suppress the occurrence of wrinkling and/or scratching during transportation.

Based on this idea, the present inventors conducted rigorous investigation in order to achieve the objects described above, and as a result, have focused on the amount of sodium ions adhering to the glass cloth before heating de-oiling processing. The present inventors have discovered that by washing the glass cloth with water having a sodium ion content of 20 ppm or less, it is possible to suppress a decrease in strength of the glass cloth due to the devitrification phenomenon of quartz glass cloths, even at high temperatures of 700° C. or higher, and have completed the present invention. By suppressing a decrease in strength of the glass cloth due to the devitrification phenomenon of quartz glasses, it is easier to control the tension during transportation of the glass cloth and it has become possible to obtain a glass cloth which has suppressed variations in the basis weight thereof and have less wrinkling and/or scratching and which is less prone to tearing. Some of the aspects of the present invention are illustrated below.

[1]

A glass cloth, comprising woven glass yarns each containing a plurality of filaments, wherein a bulk dissipation factor of a glass in the glass yarns is 0.0010 or less, a tensile strength of warp yarns per thickness of the glass cloth as represented by the following formula (A) is in the range of 0.50 to 6.0:

warp direction tensile strength (N/25 mm) of the glass cloth/thickness (μm) of the glass cloth (A), a coefficient of variation of the warp direction tensile strength of the glass cloth is in the range of 15% or less, and a dissipation factor of the glass cloth at 10 GHz is in the range of greater than 0 and 0.0010 or less.

[2]

A glass cloth, comprising woven glass yarns each containing a plurality of filaments, wherein a bulk dissipation factor of a glass in the glass yarns is 0.0010 or less, a tensile strength of warp yarns per thickness of the glass cloth as represented by the following formula (A) is in the range of 0.50 to 6.0:

warp direction tensile strength (N/25 mm) of the glass cloth/thickness (μm) of the glass cloth (A), a coefficient of variation of a filament diameter of glass fibers constituting the glass cloth is in the range of 10% or less, and a dissipation factor of the glass cloth at 10 GHz is in the range of greater than 0 and 0.0010 or less.

[3]

The glass cloth according to Item 1 or 2, wherein the dissipation factor of the glass cloth at 10 GHz is in the range of greater than 0 and 0.0055 or less.

[4]

The glass cloth according to any one of Items 1 to 3, wherein a silicon (Si) content of the glass yarns is 95.0% by mass to 100% by mass in terms of silicon dioxide ($SiO_2$).

[5]

The glass cloth according to any one of Items 1 to 4, wherein a silicon (Si) content of the glass yarns is 99.0% by mass to 100% by mass in terms of silicon dioxide ($SiO_2$).

[6]

The glass cloth according to any one of Items 1 to 5, wherein the glass yarns are treated with a surface treatment agent containing a silane coupling agent.

[7]

The glass cloth according to Item 6, wherein the surface treatment agent contains a silane coupling agent having a structure represented by the following general formula (1):

$$X(R)_{3-n}SiY_n \quad (1)$$

where X is an organic functional group having at least one of an amino group and a radical-reactive unsaturated double bond group, each Y is independently an alkoxy group, n is an integer from 1 to 3, and each R is independently a group selected from the group consisting of a methyl group, an ethyl group, and a phenyl group.

[8]

The glass cloth according to Item 7, wherein X in formula (1) is an organic functional group that does not form a salt with an ionic compound.

[9]

The glass cloth according to Item 7 or 8, wherein X in formula (1) does not contain an amine or an ammonium cation.

[10]

The glass cloth according to any one of Items 7 to 9, wherein X in formula (1) is an organic functional group having one or more methacryloxy groups or acryloxy groups.

[11]

The glass cloth according to any one of Items 1 to 10, wherein a loss on ignition value of the glass cloth is 0.01% by mass or more and less than 0.18% by mass.

[12]

The glass cloth according to any one of Items 1 to 11, wherein a dissipation factor of the glass cloth at 10 GHz is in the range of 0.00050 or less.

[13]

The glass cloth according to any one of Items 1 to 12, wherein a thickness of the glass cloth is 60 μm or less.

[14]

The glass cloth according to any one of Items 1 to 13, wherein a coefficient of variation of the basis weight ($g/m^2$) of the glass cloth is 3% or less.

[15]

The glass cloth according to any one of Items 1 to 4, wherein a coefficient of variation of the basis weight ($g/m^2$) of the glass cloth is 1.5% or less.

[16]

The glass cloth according to any one of Items 1 to 15, wherein a void number five minutes later is 180 or less when the glass cloth is impregnated with castor oil.

[17]

The glass cloth according to any one of Items 1 to 16, for printed circuit boards.

[18]

A prepreg, comprising the glass cloth according to any one of Items 1 to 17, a thermosetting resin, and an inorganic filler.

[19]

A printed circuit board, comprising the prepreg according to Item 18.

[20]

An integrated circuit, comprising the printed circuit board according to Item 19.

[21]

An electronic device, comprising the printed circuit board according to Item 19.

[22]

A method for the production of a glass cloth, comprising the step of washing a glass cloth with water having a sodium ion content of 20 ppm or less.

[23]

The method for the production of a glass cloth according to Item 22, comprising, after the step of washing the glass cloth, a step of heating de-oiling the glass cloth.

[24]

The method for the production of a glass cloth according to Item 23, wherein the step of heating de-oiling comprises a step of heating de-oiling at 700° C. or higher.

[25]

The method for the production of a glass cloth according to any one of Items 22 to 24, wherein the step of washing the glass cloth comprises a step of immersing the glass cloth in water having a sodium ion content of 20 ppm or less.

[26]

The method for the production of a glass cloth according to any one of Items 22 to 25, wherein the step of washing the glass cloth comprises a step of washing the glass cloth using ultrasonic waves while immersing the glass cloth in water having a sodium ion content of 20 ppm or less.

[27]

The method for the production of a glass cloth according to any one of Items 22 to 26, wherein the step of washing the glass cloth comprises a step of washing the glass cloth with water having a sodium ion content of 20 ppm or less using a sprayer.

[28]

The method for the production of a glass cloth according to any one of Items 22 to 27, wherein the step of washing the glass cloth comprises a step of washing the glass cloth with water having a sodium ion content of 20 ppm or less while transporting the glass cloth.

[29]

The method for the production of a glass cloth according to any one of Items 22 to 28, comprising the steps of washing the glass cloth with water having a sodium ion content of 20 ppm or less while transporting the glass cloth; and heating the glass cloth at a temperature of 700° C. or higher.

[30]

The method for the production of a glass cloth according to any one of Items 22 to 29, wherein a silicon (Si) content of the glass yarns constituting the glass cloth is 95.0 to 100% by mass in terms of silicon dioxide ($SiO_2$).

Advantageous Effects of Invention

According to the present invention, a low dielectric glass cloth which has suppressed variations in basis weight, has excellent dielectric properties (for example, low dissipation factor), and has few appearance defects, and a prepreg containing this glass cloth can be provided. The present invention can provide a printed circuit board, an integrated circuit, and an electronic device, with which yield can be improved by using this prepreg. According to the present invention, a method for the production of a glass cloth for suitably obtaining the glass cloth described above can be provided.

DESCRIPTION OF EMBODIMENTS

Embodiments of the present invention (hereinafter referred to as the "present embodiment") will be described below, but the present invention is not limited thereto, and various changes can be made without deviating from the spirit of the present invention. In the present embodiment, numerical ranges described using "to" represent numerical ranges including the numerical values before and after "to" as the lower limit and upper limit thereof, respectively. Furthermore, in the present embodiment, in numerical ranges described in stages, the upper limit or lower limit described in a certain numerical range can be replaced with the upper limit or lower limit of another numerical range described in stages. Furthermore, in the present embodiment, the upper limit value or lower limit value described in a certain numerical range can be replaced with the values shown in the Examples. In the present embodiment, the term "step" includes not only independent steps, but also steps which cannot be clearly distinguished from other steps, as long as the purpose of the step is achieved.

[Glass Cloth]

[Overall Configuration]

The glass cloth according to the present embodiment is a glass cloth comprising woven glass yarns, wherein

- a bulk dissipation factor of a glass in the glass yarns is 0.0010 or less,
- a tensile strength of warp yarns per thickness of the glass cloth as represented by the following formula (A) is in the range of 0.50 to 6.0:

$$\text{warp direction tensile strength (N/25 mm) of glass cloth/thickness } (\mu m) \text{ of glass cloth} \quad (A),$$

- a coefficient of variation (CV) of the warp direction tensile strength of the glass cloth is in the range of 15% or less, and
- a dissipation factor of the glass cloth at 10 GHz is in the range of greater than 0 and 0.0010 or less.

According to this, it is possible to provide a glass cloth and a prepreg which have suppressed variations in basis weight, have excellent dielectric properties (for example, low dissipation factor), and have few appearance defects.

It should be noted that, as will be described in the Examples, for the glass cloth to have suppressed variations in basis weight can be confirmed by the coefficient of variation of the basis weight of the glass cloth being equal to or less than a predetermined value.

It should be noted that in the present description, the concept of "have suppressed variations in basis weight" also includes the basis weight not varying.

The glass cloth according to the present embodiment can comprise woven glass yarns (for example, glass yarns composed of a plurality of glass filaments) as warp and weft yarns. Examples of the weave structure of the glass cloth include weave structures such as plain weave, basket weave, satin weave, and twill weave. Among these, the plain weave structure is preferable.

The warp and weft yarns constituting the glass cloth according to the present embodiment preferably have a weave density of 10 to 120 yarns/inch (=10 to 120 yarns/25 mm), and more preferably 40 to 100 yarns/inch. When the weave density is within the above range, the effects of the present invention can easily be obtained. The warp and weft weave densities may be different.

The basis weight of the glass cloth (mass of the glass cloth) according to the present embodiment is preferably 8 to 250 g/m$^2$, more preferably 8 to 100 g/m$^2$, further preferably 8 to 80 g/m$^2$, and particularly preferably 8 to 50 g/m$^2$. When the basis weight of the glass cloth is within the above range, the effects of the present invention can easily be obtained.

The coefficient of variation (CV) of the basis weight of the glass cloth according to the present embodiment is preferably 3% or less, more preferably 1.5% or less, further preferably 1.3% or less, even further preferably 1% or less, and particularly preferably 0.9% or less. When the coefficient of variation of the basis weight of the glass cloth is within the above range, the tensile strength of the glass cloth will have little variation and it will be easier to obtain a glass cloth with excellent appearance. Another significant advantage is that the resin content of the prepreg can be easily controlled. The lower limit of the coefficient of variation is theoretically 0.

In the present embodiment, the warp direction tensile strength per thickness of the glass cloth is preferably in the range of 0.50 or more, more preferably in the range of 0.52 or more, further preferably in the range of 0.54 or more, even further preferably in the range of 0.56 or more, and particularly preferably in the range of 0.58 or more. When the warp direction tensile strength per thickness of the glass cloth is less than 0.50, since sufficient tension cannot be applied during transportation of the glass cloth, wrinkling and/or scratching due to unexpected contact with equipment or the like are likely to occur. The warp direction tensile strength per thickness of the glass cloth may be 6.0 or less, 5.0 or less, 4.0 or less, 3.5 or less, or 3.0 or less.

The coefficient of variation of the warp direction tensile strength of the glass cloth according to the present embodiment is preferably less than 15%, more preferably 10% or less, further preferably 7% or less, even further preferably 5% or less, and particularly preferably 3% or less. When the coefficient of variation of the tensile strength exceeds 15%, wrinkling and the like are likely to occur in the glass cloth during transportation of the glass cloth.

Another aspect of the glass cloth according to the present embodiment is a glass cloth comprising woven glass yarns each containing a plurality of filaments, wherein

- a bulk dissipation factor of a glass in the glass yarns is 0.0010 or less,
- a tensile strength of warp yarns per thickness of the glass cloth as represented by the following formula (A) is in the range of 0.50 to 6.0:
- warp direction tensile strength (N/25 mm) of glass cloth/thickness (μm) of glass cloth . . . (A),
- a coefficient of variation of a filament diameter of glass fibers constituting the glass cloth is in the range of 10% or less, and
- a dissipation factor of the glass cloth at 10 GHz is in the range of greater than 0 and 0.0010 or less.

According to this, it is possible to provide a glass cloth and prepreg which have suppressed variations in basis weight, have excellent dielectric properties, and have few appearance defects.

The coefficient of variation of the filament diameter is preferably less than 10%, more preferably 7% or less, further preferably 5% or less, even further preferably 4% or less, and particularly preferably 3% or less. When the coefficient of variation of the filament diameter of the glass fibers exceeds 10%, wrinkling and the like are likely to occur in the glass cloth during transportation of the glass cloth.

The coefficient of variation of the warp direction tensile strength and the coefficient of variation of the filament diameter can be calculated using the following formulas, respectively:

(Standard deviation of warp direction tensile strength/average warp direction tensile strength)×100

(Standard deviation of filament diameter/average filament diameter)×100

The average tensile strength is the average value when the warp direction tensile strength of the glass cloth is determined at five points, and the average filament diameter is the average value when the filament diameter is determined at 10 points. Values of the tensile strength obtained at multiple points and values of the filament diameter obtained at multiple points may be used to calculate the standard deviation of tensile strength and the standard deviation of filament diameter, respectively.

A glass cloth wherein the coefficient of variation is small has a relatively low variation in warp direction tensile strength or a relatively low variation in filament diameter, and thus, has high uniformity and, by extension, few appearance defects. The lower limit of the coefficient of variation is theoretically 0. The coefficient of variation can be controlled by adjusting the amount of sodium ions adhering to the surface of the glass cloth before heating de-oiling (washing the surface of the glass cloth with high-purity washing water to adjust the amount of sodium ions). For example, the coefficient of variation can be controlled by controlling the immersion time (seconds) of the gray cloth in the washing water containing sodium ions. By securing the immersion time (seconds) at a predetermined period of time, the washing effect of the washing liquid can easily be sufficiently obtained, and thus, the effects of the present embodiment can easily be achieved.

The thickness of the glass cloth according to the present embodiment is preferably 60 μm or less, more preferably 55 μm or less, and further preferably 50 μm or less. When the thickness of the glass cloth is within the above range, the effects of the present invention can easily be obtained. The thickness of the glass cloth may be greater than 0, 5 μm or more, or 5 μm or more.

[Glass Yarns]

The glass yarns constituting the glass cloth according to the present embodiment are obtained using a low-dielectric glass as a raw material. Specifically, the glass yarns have a Si content of in the range of 95.0 to 100% by mass in terms of $SiO_2$. By using such glass yarns, for example, it is possible to improve the dielectric properties of the resulting glass cloth. From the viewpoint of improving the dielectric properties of the resulting glass cloth, the Si content is preferably in the range of 99.0 to 100% by mass, more preferably in the range of 99.5 to 100% by mass, and further preferably in the range of 99.9 to 100% by mass.

When glass containing 99.0% by mass or more in terms of $SiO_2$ is in a bulk state with a certain thickness, the dissipation factor thereof (bulk dissipation factor) is generally represented by the relationship of the following formula (2):

$$\text{Bulk dissipation factor} \leq 1.2\times 10^{-3} \quad (2)$$

The average filament diameter of the glass filaments constituting the glass yarns is preferably 2.5 to 9.0 μm, more preferably 2.5 to 7.5 μm, further preferably 3.5 to 7.0 μm, even further preferably 3.5 to 6.0 μm, and particularly preferably 3.5 to 5.0 μm. When the filament diameter is less than the above value, the breaking strength of the filament will be low, whereby the resulting glass cloth is likely to have fuzz. When the filament diameter exceeds the above value, the mass of the glass cloth increases, making transportation and processing difficult. When the average filament diameter of the glass filament is within the above range, the effects of the present invention can easily be obtained.

[Silane Coupling Agent]

The glass yarns (including glass filaments) constituting the glass cloth are preferably surface-treated with a silane coupling agent. Specifically, in an embodiment, the surface treatment agent for the glass yarns includes a silane coupling agent. As the silane coupling agent, it is preferable to use a silane coupling agent represented by the following formula (1):

$$X(R)_{3-n}SiY_n \quad (1)$$

where X is an organic functional group having at least one of an amino group and a radical-reactive unsaturated double bond group, each Y is independently an alkoxy group, n is an integer from 1 to 3, and each R is independently a group selected from the group consisting of a methyl group, an ethyl group, and a phenyl group.

In the present embodiment, attention was paid to the causes of increase in the dissipation factor of glass cloth, which are conventionally considered as follows:

(i) very small amounts of thermal oxidative degradation products of the sizing agent which remain physically adhering to the surface of the glass yarn; and (ii) residues of surface treatment agents or modified substances thereof which physically adhere to the glass surface without forming chemical bonds and cannot be decreased by washing with water.

From the viewpoint of suppressing (i) the occurrence of thermal oxidation degradation products and/or (ii) the occurrence of residues or modified substances thereof, X in formula (1) is preferably an organic functional group that does not form a salt with an ionic compound. From the viewpoint of reactivity with the matrix resin, X in formula (1) is more preferably an organic functional group having one or more methacryloxy groups or acryloxy groups. From the viewpoint of easily exhibiting the effects of the present invention, X in formula (1) preferably does not contain an amine such as a primary amine, a secondary amine, or a tertiary amine, or an ammonium cation such as a quaternary ammonium cation.

Regarding Y in the above formula (1), the alkoxy group is preferably an alkoxy group having 1 to 5 carbon atoms (1, 2, 3, 4, or 5 carbon atoms) for the glass cloth to be stably treated.

As a surface treatment agent, the silane coupling agent shown in formula (1) may be used alone, or may be used in combination with two or more silane coupling agents in which X in formula (1) is different. As the silane coupling agent represented by formula (1), for example, simple substances such as vinyltrimethoxysilane, 3-methacryloxypropyltrimethoxysilane, acryloxypropyltrimethoxysilane, 3-acryloxypropyltrimethoxysilane, and 5-hexenyltrimethoxysilane, or mixtures of these can be used.

The molecular weight of the silane coupling agent is preferably 100 to 600, more preferably 150 to 500, and further preferably 200 to 450. Among these, it is particularly preferable to use two or more silane coupling agents having different molecular weights. By treating the surface of the glass yarns with two or more silane coupling agents having different molecular weights, the density of the treatment agent on the glass surface tends to increase, whereby the reactivity with the matrix resin tends to be further improved.

The silane coupling agent is preferably nonionic from the viewpoint of not inhibiting reactivity with the resin. Among nonionic silane coupling agents, a silane coupling agent having at least one group selected from the group consisting of a vinyl group, a methacryloxy group, and an acryloxy group is preferable, and among these, silane coupling agents having at least one methacryloxy group or acryloxy group are particularly preferable. Since the reactivity with the resin is not inhibited, the heat resistance and reliability of the printed circuit board can be improved.

In an embodiment, in formula (1), X is an organic functional group having at least one of an unsaturated double bond group and an amino group. Thus, not only an embodiment in which X has both the unsaturated double bond group and the amino group, but also an embodiment in which X has the unsaturated double bond group but does not have the amino group, and an embodiment in which X does not have the unsaturated double bond group but has the amino group are included within the scope of formula (1). However, X in formula (1) is preferably the unsaturated double bond group, and preferably does not have an amino group.

From the viewpoint of reducing the dissipation factor of the glass cloth, the loss on ignition value of the glass cloth according to the present embodiment is preferably 0.01% by mass or more and less than 0.180% by mass, and is preferably 0.01% by mass or more and less than 0.174% by mass, more preferably 0.01% by mass or more and less than 0.150% by mass, and further preferably 0.01% by mass or more and less than 0.130% by mass. When the loss on ignition value is 0.180% by mass or more, residues of the surface treatment agent and/or modified substances thereof which physically adhere to the glass surface without forming chemical bonds and cannot be decreased by washing with water will be present in a greater amount on the glass surface. As a result, the dissipation factor of the glass cloth tends to increase. When the loss on ignition value is less than 0.010% by mass, adhesion between the resin and glass cloth tends to be insufficient, whereby the heat resistance and insulation reliability are likely to be poor in use as a printed circuit board.

[Bulk Dissipation Factor]

As used herein, "bulk dissipation factor" refers to the dissipation factor of the raw material of the glass cloth measured at 10 GHz using a split cylinder resonator. The raw material of the glass cloth may be, for example, glass raw materials such as glass seeds, glass filaments, and glass yarns, as will be described below. The bulk dissipation factor of the glass raw material constituting the glass cloth can be measured using a glass plate having a thickness of 300 μm or less and having the same type and composition as the glass cloth, in the same manner as the dissipation factor measurement of glass cloth.

From the viewpoint of further improving the effects of the present invention, when weaving the glass cloth according to the present embodiment, the bulk dissipation factor of the glass constituting the glass yarns, when measured at 10 GHz using a split cylinder resonator, is preferably $2.5\times10^{-3}$ or less, more preferably $2.0\times10^{-3}$ or less, further preferably $1.7\times10^{-3}$ or less, even further preferably $1.5\times10^{-3}$ or less, even further preferably $1.2\times 10^{-3}$ or less, particularly preferably $1.0\times10^{-3}$ or less, and most preferably $8.0\times10^{-4}$ or less. The bulk dissipation factor may be greater than 0.

Though not to be bound by theory, it is believed that the dissipation factor of the glass cloth, the bulk dissipation factor, and the difference therebetween can be adjusted to within the numerical value ranges described above by, for example:

selecting the surface treatment agent so as to suppress the residues and occurrence of (i) or (ii) below;

optimizing the conditions of the heating de-oiling (heating de-sizing) step, residual adhesive decreasing step, fixing step, washing step, drying step, final washing step, and final drying step in the glass cloth production process; and washing the surface-treated glass cloth with an organic solvent in the final washing step.

(i) the occurrence of thermal oxidative degradation products of the sizing agent which physically adhere to the surface of the glass yarns; and (ii) the occurrence of residues of surface treatment agent and/or modified substances thereof which physically adhere to the glass surface without forming chemical bonds and cannot be decreased by washing with water.

[Method for Measuring Dissipation Factor of Glass Cloth]

The dielectric properties of the glass cloth according to the present embodiment can be measured using the resonance method. A split cylinder resonator is a preferable example of a measurement device using the resonance method. According to the resonance method, measurements can be made more easily and accurately than conventional measurement methods in which a printed circuit board as a measurement sample is produced and the dielectric properties are evaluated. The reason for this is, though not to be bound by theory, that the resonance method is suitable for evaluating low-loss materials in high-frequency range. In addition to the resonance method, the lumped parameter method and the reflection transmission method are known as evaluation methods of dielectric properties. In the lumped parameter method, it is necessary to form a capacitor by interposing a measurement sample between two electrodes, and as a result, there is a problem in that the operation is very complicated. The reflection transmission method has a problem in that it is difficult to evaluate the dissipation factor of a sample with high accuracy when evaluating a low-loss material because of the strong influence of port matching characteristics.

When measuring the dielectric properties of the glass cloth according to the present embodiment, which is applicable to printed circuit boards, and in particular, printed circuit boards for high-speed communication, the measurable range of the measurement device is preferably a suitable range for both the frequency permittivity (Dk) and the dissipation factor (Df). For example, Dk is preferably in the range of 1.1 to 50 $Fm^{-1}$, more preferably in the range of 1.5 to 10 $Fm^{-1}$, and further preferably in the range of 2.0 to 5 $Fm^{-1}$. Further, Df may be greater than 0, and is preferably in the range of $1.0\times10^{-6}$ to $1.0\times10^{-1}$, more preferably in the range of $1.0\times10^{-5}$ to $5.0\times10^{-1}$, and further preferably in the range of $5.0\times10^{-5}$ to $1.0\times10^{-2}$.

It is preferable that the measurable frequency of the measurement device be 10 GHz or more. When the frequency is 10 GHz or more, it is possible to perform characteristic evaluation in the frequency band region expected when the glass cloth is actually used as a printed circuit board for high-speed communication.

The measurement area is preferably 10 $mm^2$ or more, more preferably 15 $mm^2$ or more, and further preferably 20 $mm^2$ or more. By measuring the dielectric properties of the glass cloth over a larger measurement area, the reliability of inspection results for the glass cloth can be increased.

The measurable thickness of the sample is preferably 3 μm to 300 μm, more preferably 5 μm to 200 μm, and further preferably 7 μm to 150 μm. According to this, the reliability of the inspection results for the glass cloth can be increased.

It is possible to have a rough estimate of the dissipation factor of the glass cloth from the bulk dissipation factor, and vice versa. Conversely, the dissipation factor of the glass cloth may sometimes be different from the bulk dissipation factor. The reasons for this difference, though not to be bound by theory, include, for example, (1) the occurrence of thermal oxides of the sizing agent and/or degradation products thereof physically adhered to the surface of glass yarns, and (2) the residues and occurrence of unnecessary components which physically adhered to the surface of glass yarns without forming chemical bonds and could not be washed out completely. Thus, the dissipation factor of the glass cloth can be controlled within the above range by selecting the type of the sizing agent and optimizing various conditions in the glass cloth production process.

In the glass cloth according to the present embodiment, the dissipation factor at 10 GHz as measured by the resonance method described above is preferably 0.0010 or less. With such a glass cloth, a prepreg which can improve dielectric properties can be provided. The dissipation factor of the glass cloth at 10 GHz is preferably 0.0009 or less, more preferably 0.0008 or less, further preferably 0.00055 or less, further preferably 0.00053 or less, further preferably 0.00050 or less, further preferably 0.00045 or less, further preferably 0.00040 or less, and particularly preferably 0.00035 or less. With such a glass cloth, a prepreg which can further improve dielectric properties can be provided. The lower limit may be greater than 0.

[Impregnation Properties of Glass Cloth]

It is preferable that the glass cloth according to the present embodiment have a void number five minutes later of 180 or less, when the glass cloth is impregnated with castor oil. According to this, since the glass cloth has suitable impregnation properties with the resin, the insulation properties and heat resistance of the printed circuit board can easily be improved. The number of voids five minutes later is preferably in the range of 160 or less, more preferably in the range of 140 or less, further preferably in the range of 120 or less, and particularly preferably in the range of 100 or less. The smaller the number of voids five minutes later, the better the impregnating properties and the stronger the adhesion between the glass cloth and the resin becomes. Thus, a printed circuit board having suitable insulation reliability and heat resistance can easily be provided. In order to control the number of voids five minutes later to 180 or less, when the glass cloth is impregnated with castor oil, for example, it is effective to treat the glass cloth with a silane coupling agent represented by formula (1) described above and to use a fiber-opening technique such as dry ice blasting processing or bending processing.

[Method for Production of Glass Cloth]

The method for the production of the glass cloth according to the present embodiment comprises a step of washing the glass cloth with water having a sodium ion content of 20 ppm or less. The method for the production of the glass cloth according to the present embodiment can comprise the steps of subjecting the glass cloth to a heating de-oiling treatment, and treating the glass cloth using a surface treatment agent.

[Method for Heating De-Oiling of Glass Cloth]

In the method for heating de-oiling of the glass according to the present embodiment, it is possible to reduce the dissipation factor of the glass cloth by performing heating de-oiling of the glass cloth composed of glass yarns with a Si content of 95.0 to 100% by mass in terms of $SiO_2$ at a temperature of 700° C. or higher. From the viewpoint of suitably obtaining the effects of the present embodiment, the temperature of the heating de-oiling is preferably in the range of 700 to 1500° C., more preferably in the range of 800 to 1300° C., and further preferably in the range of 900 to 1100° C. When the heating de-oiling temperature is lower than 700° C., it is difficult to reduce the dissipation factor of the glass cloth because it is not possible to sufficiently remove adhesive residue adhering to the glass cloth. Conversely, when the heating de-oiling temperature exceeds 1500° C., it becomes difficult to suppress the devitrification phenomenon of the glass, and it is difficult to prevent the strength of the glass cloth from decreasing. The heating time can be appropriately selected, and is, for example, 3 to 120 seconds.

As a means for heating the glass cloth, known heating methods, heating media, heating mechanisms, heating devices, and heating members can be used as long as heating is performed so that the heating de-oiling temperature is 700° C. or higher, and for example, (1) heating the glass cloth in a heating furnace, (2) bringing the glass cloth into contact with a heating member, or (3) applying high-temperature steam to the glass cloth may be used. By heating the glass cloth so that the heat de-oiling temperature is 700° C. or higher, it is possible to efficiently remove organic matter adhering to the surface of the glass cloth and reduce the time required to remove the organic matter. Heating of the glass cloth can be carried out sequentially or continuously, in a closed system or in an open system, or in a combination of closed and open systems.

In the case of a closed system, from the viewpoint of suitable heating by the heating means, it is preferable to place the glass cloth in a heating furnace, and/or from the viewpoint of storage space and heating range, it is preferable that the glass cloth be heated while being stored in the form of a roll. From the viewpoint of increasing the efficiency of organic matter removal and shortening the time for removing organic matter, it is also preferable that the glass cloth be heated while being transported in a heating furnace.

In the case of an open system, from the viewpoint of the area to be heated, it is preferable that the glass cloth be heated while being transported. The glass cloth can be transported by, for example, an unwinding mechanism and a winding mechanism.

[Heating Furnace]

As the heating means of the heating furnace, various means such as electric heaters and burners can be considered as long as the heating means can be heated so that the heating de-oiling temperature becomes 700° C. or higher, and the heating means is not limited to a specific means. Though heating may be performed by combining a plurality of means, it is preferable to use a gas single radiant tube burner or an electric heater.

From the viewpoint of heating efficiency, the heating furnace preferably comprises means for discharging gas generated within the heating furnace and/or air circulation means. The gas discharging means may be, for example, a nozzle, a gas pipe, a small hole, or a gas vent valve. The air circulation means may be, for example, a fan or an air conditioner.

In order to efficiently remove organic matter adhering to the glass cloth surface, a continuous method, in which the glass cloth can be heated while being passed through the heating furnace continuously, is more preferable than a batch method, which involves winding the glass fiber fabric around a core and heating the glass cloth at a predetermined ambient temperature. It is most preferable to use a method in which the glass cloth can be continuously washed with reverse osmosis (RO) water.

[Contact Member for Heating Glass Cloth]

Though the heating furnace described above may be used as the method for heating the glass cloth, from the viewpoint of low running costs, the glass cloth may also be heated by bringing the glass cloth into contact with a member heated to a predetermined temperature.

Though the shape of the contact member is not particularly limited as long as heating is achieved so that the heating de-oiling temperature of the glass cloth is 700° C. or higher, a roll shape is preferable from the viewpoint of ease of transporting the glass cloth. As a member capable of heating the glass cloth in the form of a roll, it is preferable to use a roller which is heated by an induction heating method, and which can be used in the high-temperature range and has relatively little variation in temperature in the width direction. When heating the glass cloth with a contact member, it is considered that the temperature of the contact member and the surface temperature of the glass cloth are approximately equal.

In order to remove carbide adhering to the heating roller as the glass cloth is continuously heated, the heating roller method described above is preferably a method having a mechanism for removing contaminants and foreign matter adhering to the roller, such as a mechanism equipped with a blade.

[Means for Applying High-Temperature Steam to Glass Cloth (Steam Application Means)]

The steam applied to the glass cloth may contain, for example, volatile solvents, water vapor, and gases other than water vapor, and from the viewpoint of toxicity to the human body and the tendency to accelerate the decomposition of the sizing agent used for glass fibers, water vapor is preferable. Regarding the temperature of the high-temperature steam, if necessary, a method of supplying high-temperature steam and heated air at an arbitrary ratio may be used to cause the temperature on the surface of the glass cloth to be a temperature higher than 650° C. The temperature of the high-temperature steam is 400° C. or higher, preferably 450° C. or higher, more preferably 550° C. or higher, further preferably 600° C. or higher, and particularly preferably 650° C. or higher. Examples of the steam application means include, but are not limited to, spraying, shower diffusion, jet nozzles, and the like. Alternatively, the gas discharged from the heating furnace may be reused as the high-temperature steam.

As a result of rigorous investigation by the present inventors, it was discovered that when the amount of sodium ions adhering to the surface of glass cloth exceeds a predetermined amount, subjecting the glass cloth to a heating de-oiling treatment at 700° C. or higher causes the tensile strength of the glass cloth to significantly decrease due to the devitrification phenomenon of quartz glass. In order to suppress the devitrification phenomenon, it was discovered that by washing the glass cloth with water having a sodium ion content of 20 ppm or less before heating de-oiling treatment, the amount of sodium ions in the glass surface is reduced, whereby it is possible to suppress the devitrification phenomenon of quartz glass even when the heat de-oiling treatment is performed at 700° C. or higher. By maintaining the strength of the glass cloth after being heating de-oiled, it is possible to suppress wrinkling and/or scratching during the step of treating the glass cloth with a surface treatment agent.

From the viewpoint of suitably obtaining the effects of the present embodiment, the sodium ion content of the water for washing is preferably in the range of 18 ppm or less, more preferably in the range of 15 ppm or less, further preferably in the range of 12 ppm or less, even further preferably in the range of 10 ppm or less, and particularly preferably in the range of 7 ppm or less. When the sodium ion content of the washing water exceeds 20 ppm, it will not be possible to suppress the devitrification phenomenon of quartz glass when the heating de-oiling is performed at 700° C. or higher, whereby a decrease in the tensile strength of the glass cloth occurs. The lower limit of the sodium ion content is preferably zero, but may exceed zero.

The means for washing the glass cloth with water having a sodium ion content of 20 ppm or less may be any known washing method as long as the sodium ions on the glass surface can be removed. For example, methods using ultrasonic waves (for example, using an ultrasonic vibrator), spraying (for example, high-pressure spraying) and steam atomization can be considered. From the viewpoint of low-cost processing, a method of immersing the glass cloth in a water tank storing the washing water (water having a sodium ion content of 20 ppm or less) and then removing excess washing water with a squeeze roller or the like and thereafter drying the glass cloth is preferable. In this case, the immersion time may be, for example, 2 seconds or more, 5 seconds or more, 10 seconds or more, or 15 seconds or more, and may be 120 seconds or less, 90 seconds or less, 60 seconds or less, or 45 seconds or less.

The method for producing the water having a sodium ion content of 20 ppm or less may be any known production method. For example, methods such as filtration using an RO membrane and deionization using an ion exchange resin can be considered. The "water having a sodium ion content of 20 ppm or less" may contain other liquid components (liquids other than water, etc.) within a range that does not impede the effects of the present invention.

[Glass Cloth Heating De-Oiling Device]

As described above, the glass cloth heating de-oiling device according to the present embodiment can heat the glass cloth so that the glass cloth heating de-oiling temperature becomes 700° C. or higher. More specifically, the glass cloth heating de-oiling device can be configured as follows:

the device has an unwinding mechanism and a winding mechanism, and the glass cloth heating de-oiling device preferably comprises a heating furnace which is capable of carrying out the steps of washing the glass cloth with the water having a sodium ion content of 20 ppm or less while transporting the glass cloth to remove sodium ions in the glass surface, and heating the glass cloth to a heating de-oiling temperature of 700° C. or higher.

The unwinding mechanism and the winding mechanism may be, for example, at least a pair of rollers, or a Roll-to-Roll system. The heating furnace, air circulation means, contact members, and steam application means are as described in the method for the production of the glass cloth.

[Glass Cloth Surface Treatment Method]

The glass treatment method according to the present embodiment can be applied to glass yarns and also to the glass cloth. In other words, the step of weaving glass yarns to obtain a glass cloth may be provided before, during, or after the glass processing method according to the present embodiment. In addition, in the glass treatment method according to the present embodiment, "decreasing" means, for example, removing at least a part of the surface treatment agent containing the sizing agent or the silane coupling agent, and allows for the occurrence of residual material that could not be completely removed.

The step of adhering the surface treatment agent can comprise at least one of, for example, a coating step in which a silane coupling agent is caused to adhere to the surface of the glass using a treatment liquid with a concentration of 0.1 to 0.5% by mass; and a fixing step in which the silane coupling agent is fixed onto the surface of the glass by heat-drying. As a result, suitable surface treatment of the glass becomes easy.

As the method for coating the glass with the treatment liquid in the coating step, (a) a method of storing the treatment liquid in a bath and immersing and passing the glass through the treatment liquid (hereinafter referred to as "immersion method") or (b) a method of coating the glass with the treatment liquid using a roll coater, die coater, gravure coater, etc., may be adopted. In the case of the immersion method, it is preferable to select the time of immersing the glass in the treatment liquid so as to be 0.5 seconds or more and 1 minute or less. In the case of the immersion method, the glass can be passed through the treatment liquid at a transport speed of 10 to 50 m/min while applying a predetermined tension (for example, 100 to 250 N) to the glass. Furthermore, after coating the glass with the treatment liquid, the solvent contained in the treatment liquid can be heat-dried using a method such as hot air or electromagnetic waves.

The concentration of the treatment liquid is preferably 0.1 to 0.5% by mass, more preferably 0.1 to 0.45% by mass, and further preferably 0.1 to 0.4% by mass. According to this, it is easy to appropriately subject the glass cloth to the surface treatment.

In the fixing step, the heat-drying temperature is preferably 80° C. or higher, and more preferably 90° C. or higher, so that the reaction between the silane coupling agent and the glass is sufficiently carried out. Further, the heat-drying temperature is preferably 300° C. or lower, and more preferably 180° C. or lower, in order to prevent degradation of the organic functional groups contained in the silane coupling agent.

The step of decreasing the silane coupling agent can include, for example, at least one of a washing step of washing to remove the silane coupling agent that did not form chemical bonds with the glass surface, a drying step of heat-drying the glass after washing, and a final washing step for decreasing unnecessary components which did not form chemical bonds with the glass surface and which could not be completely removed by washing. This makes it easier to control the loss on ignition value. It should be noted that the step of decreasing the silane coupling agent can include, for example, a final drying step after the final washing step.

Among these, in the final washing step, it is possible to decrease unnecessary components that have not formed chemical bonds with the surface of the glass and which were not completely removed by washing with water in the washing step. In this final washing step, for example, an organic solvent can be used as the washing liquid. By including the final washing step, even if a low dielectric glass in the manner of the present embodiment is used, it becomes easier to adjust the difference between the dissipation factor of the obtained glass cloth and the bulk dissipation factor to within the numerical range described above. As the organic solvent, highly hydrophobic organic solvents are preferable, and organic solvents which have a high affinity with the residues and modified substances of the silane coupling agent having a hydroxyl group are also preferable. The washing method may be an immersion method or a shower spraying, and heating or cooling may be performed as necessary. In order to suppress re-adhering of the glass dissolved in the washing liquid, it is preferable to decrease the excess solvent from the glass after washing using a squeezing roller or the like.

As organic solvents that can be used as a washing liquid in the final washing step, for example, the following solvents can be used alone or in combination. Examples of highly hydrophobic organic solvents include:

saturated chain aliphatic hydrocarbons such as n-pentane, i-pentane, n-hexane, i-hexane, n-heptane, i-heptane, n-octane, i-octane, 2,2,4-trimethylpentane (isooctane), n-nonane, i-nonane, n-decane, i-decane, and 2,2,4,6,6-pentamethylheptane (isododecane);

saturated cycloaliphatic hydrocarbons such as cyclopentane, cyclohexane, methylcyclohexane, dimethylcyclohexane, and ethylcyclohexane;

aromatic hydrocarbons such as benzene, toluene, xylene, ethylbenzene, diethylbenzene, trimethylbenzene, and triethylbenzene; and halogen-containing solvents such as chloroform, dichloromethane, and dichloroethane. Examples of organic solvents having a high affinity for residues or modified substances of silane coupling agents include:

alcohols such as methanol, ethanol, butanol;

ketones such as acetone and methyl ethyl ketone;

ethers such as methyl ethyl ether and diethyl ether;

amides such as N,N-dimethylformamide and N,N-dimethylacetamide; and dimethyl sulfoxide. Among these, aromatic hydrocarbons, alcohols, or ketones are preferable, and methanol is more preferable, from the viewpoint that it is easy to efficiently decrease the silane coupling agent physically adhered to glass. Thus, as the washing liquid in the final washing step, it is preferable that a washing liquid in which the main component is methanol (methanol 50% by mass or more, or 60% by mass or more with respect to 100% by mass of the washing liquid) be used.

In the final drying step, the washing liquid used in the final washing step can be decreased. The washing liquid used in the final washing step preferably has a boiling point of 120° C. or lower from the viewpoint of decreasing the washing liquid by drying. For drying, heat-drying or blow-drying can be used. When using an organic solvent as the washing liquid, from the viewpoint of safety, it is preferable to perform heat-drying by hot air drying using low-pressure steam or heat medium oil as a heat source. The drying temperature is preferably the boiling point of the washing liquid or higher, and is preferably 180° C. or lower from the viewpoint of suppressing degradation of the silane coupling agent.

As the fiber-opening method in the fiber-opening step of the glass cloth, for example, a fiber-opening processing method of subjecting the glass cloth to spray water (high-pressure water fiber-opening), a vibro-washer, ultrasonic water, or mangle can be adopted. Reducing the tension applied to the glass cloth during this fiber-opening processing tends to make it possible to further reduce the air permeability. In order to suppress a decrease in the tensile strength of glass cloth due to the fiber-opening processing, measures such as reducing the friction with contact members when weaving the glass yarns, optimizing the sizing agent, and increasing the amount of adhesion are preferably taken. From the viewpoint of reducing the number of voids five minutes later when the glass cloth is impregnated with castor oil, it is effective to increase the processing pressure in the fiber-opening step. As the method for fiber-opening the glass cloth composed of glass yarns having high glass hardness, dry ice blasting processing is preferable.

Dry ice blasting processing is a method in which dry ice fine particles having a particle size of 5 to 300 μm are ejected (sprayed) from a height of 5 to 1000 mm at an air pressure of 0.05 to 1 MPa. More preferably, the dry ice blasting processing is a method in which dry ice fine particles having a particle size of 5 to 300 μm are ejected from a height of 5 mm to 600 mm at an air pressure of 0.1 to 0.5 MPa. By setting within these ranges, quality problems such as glass fiber breakage are unlikely to occur, and thus, the effect of improving impregnation properties can be secured.

The above steps need not necessarily be performed in separate steps, and a plurality of steps can also be performed in one step. For example, when the washing step is performed after the weaving step, the washing step can also serve as the fiber-opening step by using high-pressure water spray or the like. The composition of the glass cloth conventionally does not change before and after fiber-opening. Furthermore, the method for the production of the glass cloth can comprise arbitrary steps other than the steps described above. For example, a slitting processing step can be included after the fiber-opening step. Where possible, the order of the above steps can be changed.

According to the surface treatment method for the glass cloth according to the present embodiment as described above, after suitably decreasing unnecessary components that are considered to increase the dissipation factor, it becomes easier to apply the silane coupling agent to the surface of each glass filament constituting the glass yarns.

[Wrinkling and/or Scratching of Glass Cloth]

Wrinkling, which occurs during transportation of the glass cloth, and/or scratching, which occurs due to unexpected contact with equipment, are known as appearance defects of the glass cloth. It is preferable that wrinkling and/or scratching of the glass cloth not occur, since it would become a defective part when preparing a prepreg. As a method for suppressing wrinkling and/or scratching, tension control during transportation of the glass cloth is effective, and by applying sufficient tension to the glass cloth, it is possible to suppress flapping of the glass cloth, which can make wrinkling and/or scratching less likely to occur. However, if the warp direction tensile strength per thickness of the glass cloth is excessively low, sufficient tension cannot be applied to the glass cloth, making it difficult to suppress wrinkling and/or scratching. The range of warp direction tensile strength per thickness of the glass cloth is as described above. If the warp direction tensile strength per thickness of the glass cloth is less than 0.50, sufficient tension cannot be applied, because the glass cloth is likely to tear during the transportation step. In particular, after immersing the glass cloth in a surface treatment liquid and squeezing the liquid, drying is performed to fix the surface treatment agent onto the glass cloth. At this time, if sufficient tension is not applied, wrinkling at the location of liquid squeezing of the glass cloth and/or scratching due to unexpected contact with the heating furnace occurs. In the worst cases, the glass cloth becomes torn at the location of liquid squeezing.

[Tearing of Glass Cloth]

When the strength of the glass cloth is significantly reduced, the glass cloth is likely to become torn. Such a significant decrease in the strength of the glass cloth tends to occur when the glass cloth is subjected to high temperature heat treatment (for example, 700 to 1500° C.).

When the uniformity of the warp direction tensile strength and/or the uniformity of the filament diameter of the glass cloth is low, tearing is likely to occur during transportation of the glass cloth. At this time, the wrinkling and/or scratching described above are likely to occur. Thus, in the glass cloth according to the present embodiment, the coefficient of variation of the warp direction tensile strength is in the range of 15% or less and/or the coefficient of variation of the filament diameter of the glass fibers constituting the glass cloth is in the range of 10% or less. Glass cloths having coefficients of variation within the above ranges tend to have high uniformity, and by extension, tend to have few appearance defects.

It is assumed that the ratio (coefficient of variation of warp direction tensile strength/coefficient of variation of filament diameter) is in the range of 1.3 to 1.4 when the glass cloth is subjected to high-temperature heat treatment (for example, 700 to 1500° C.). At this time, in the glass cloth according to the present embodiment, this ratio (coefficient of variation of warp direction tensile strength/coefficient of variation of filament diameter) is preferably greater than 0 and 5.0 or less (excluding the range of 1.3 to 1.4). Such an embodiment is one of a glass cloth having few appearance defects.

It is assumed that the ratio (coefficient of variation of filament diameter/coefficient of variation of warp direction tensile strength) is in the range of 0.7 to 0.8 when the glass cloth is subjected to high temperature heat treatment (for example, 700 to 1500° C.). At this time, in the glass cloth according to the present embodiment, this ratio (coefficient of variation of filament diameter/coefficient of variation of warp direction tensile strength) is preferably greater than 0 and 4.5 or less (excluding the range of 0.7 to 0.8). Such an embodiment is also one embodiment of a glass cloth having few appearance defects.

[Prepreg]

The prepreg according to the present embodiment comprises the glass cloth and a matrix resin with which the glass cloth is impregnated. As a result, a prepreg having few voids can be provided.

Either of a thermosetting resin or a thermoplastic resin can be used as the matrix resin. If possible, both may be used in combination, and other resins may be further included.

Examples of the thermosetting resin include:

(a) an epoxy resin obtained by adding a compound having an epoxy group and a compound having at least one group selected from the group consisting of an amino group, phenol group, acid anhydride group, hydrazide group, isocyanate group, cyanate group, and hydroxyl group which reacts with the epoxy group;

(b) a radically polymerizable curable resin obtained by curing a compound having at least one group selected from the group consisting of an allyl group, a methacrylic group, and an acrylic group;

(c) a maleimide triazine resin obtained by reacting and curing a compound having a cyanate group and a compound having a maleimide group;

(d) a thermosetting polyimide resin obtained by reacting and curing a maleimide compound and an amine compound; and (e) a benzoxazine resin obtained by cross-linking and curing a compound having a benzoxazine ring by heat polymerization. It should be noted that to obtain the (a) epoxy resin, the compounds can be reacted without a catalyst, or with the addition of a catalyst having a reaction catalytic ability such as an imidazole compound, a tertiary amine compound, a urea compound, or a phosphorus compound. Furthermore, to obtain the (b) radically polymerizable curable resin, a thermal decomposition catalyst or a photodecomposition catalyst can be used as a reaction initiator.

Examples of the thermoplastic resin include polyphenylene ether, modified polyphenylene ether, polyphenylene sulfide, polysulfone, polyethersulfone, polyarylate, aromatic polyamide, polyetheretherketone, thermoplastic polyimide, insoluble polyimide, polyamideimide, and fluorine resin. As an insulating material for a printed circuit board for high-speed communication, polyphenylene ether or modified polyphenylene ether having high radical reactivity is preferable.

If the matrix resin used for printed circuit boards for high-speed communication has a vinyl group or methacrylic group, silane coupling agents which have a relatively high hydrophobicity and has a functional group that participates in a radical reaction, such as a methacrylic group, are compatible with the matrix resin.

As described above, a thermosetting resin and a thermoplastic resin can be used together. The prepreg can further comprise an inorganic filler. An inorganic filler is preferably used in combination with a thermosetting resin, and examples thereof include aluminum hydroxide, zirconium oxide, calcium carbonate, alumina, mica, aluminum carbonate, magnesium silicate, aluminum silicate, silica, talc, short glass fibers, aluminum borate, and silicon carbide. These inorganic fillers may be used alone or in combination of two or more thereof.

[Printed Circuit Board]

The printed circuit board according to the present embodiment comprises the prepreg described above. As a result, a printed circuit board having excellent insulation reliability can be provided.

[Integrated Circuit and Electronic Device]

Furthermore, other aspects of the present embodiment include an integrated circuit and an electronic device comprising the printed circuit board described above. The integrated circuit and electronic device obtained using the printed circuit board according to the present embodiment have excellent various characteristics.

EXAMPLES

Next, the present invention will be described in detail with reference to Examples and Comparative Examples.

[Measurement Method of Thickness of Glass Cloth]

The thickness of the glass cloth is determined in accordance with JIS R 3420 7.10. Specifically, using a micrometer, a spindle is gently rotated and brought into light parallel contact with the measurement surface of the sample. The scale is then read after the ratchet sounded three times. It should be noted that 7.10 of JIS R 3420 defines general test methods for cloth products such as glass cloths.

[Method for Measuring Basis Weight (Mass of Cloth)]

The basis weight of a cloth is obtained by cutting the cloth to a predetermined size and dividing the mass by the sample area. In the present Examples, the basis weight of each glass cloth is determined by cutting the glass cloth to a size of 10 $cm^2$ and measuring the mass 20 times. Using the obtained values, the average value ($g/m^2$) and coefficient of variation of the basis weight of each glass cloth are determined.

$$\text{Coefficient of variation (\%) of basis weight of glass cloth} = (\text{standard deviation of basis weight of glass cloth} / \text{average value of basis weight of glass cloth}) \times 100$$

[Method for Measuring Converted Thickness]

Since each glass cloth is a discontinuous planar body with air present between the glass fibers, the converted thickness is calculated by dividing the basis weight of the glass cloth (mass of the cloth) by the density of glass. Specifically, the converted thickness is calculated by the following formula:

$$\text{Converted thickness } (\mu\text{m}) = \text{basis weight } (\text{g/m}^2) / \text{density } (\text{g/cm}^3)$$

This converted thickness value is used for measurement using the resonance method.

[Method for Measuring of Dissipation Factor]

The dissipation factor of each glass cloth is measured in accordance with IEC 62562. Specifically, a glass cloth sample having a size required for measurement using a split cylinder resonator is stored in a constant temperature and humidity oven at 23° C. and 50% RH for 8 hours or more. Thereafter, the dielectric properties of the stored sample are measured using a split cylinder resonator (manufactured by EM Lab) and an impedance analyzer (manufactured by Agilent Technologies). The measurement is performed five times for each sample, and the average value is obtained. The thickness of each sample is measured using the converted thickness described above. Similarly, glass plates each having a thickness of 300 μm or less having the same composition as each glass cloth are prepared, and the bulk dissipation factor is also measured from the thickness value obtained by measuring the thickness of the glass plate. It should be noted that IEC 62562 mainly defines methods for measuring dielectric properties in the microwave band of fine ceramic materials used in microwave circuits.

[Method for Measuring Loss on Ignition Value of Glass Cloth]

The loss on ignition value of each glass loss is determined in accordance with JIS R3420.

[Tensile Strength and Coefficient of Variation of Glass Cloth]

In accordance with JIS R3420, a warp direction tensile test of the glass cloth is performed five times, and the average value thereof is taken as the warp direction tensile strength. The coefficient of variation of warp direction tensile strength is determined using the following formula:

$$\text{Coefficient of variation (\%) of warp direction tensile strength} = (\text{standard deviation of warp direction tensile strenght}/\text{average warp direction tensile strength}) \times 100$$

[Warp Direction Tensile Strength per Thickness of Glass Cloth]

Using the thickness and the warp direction tensile strength of the glass cloth, the warp direction tensile strength per thickness of the glass cloth is calculated from the following formula (A):

$$\text{Warp direction tensile strength } (N/25 \text{ mm}) \text{ of glass cloth}/\text{thickness } (\mu\text{m}) \text{ of glass cloth} \quad (A)$$

[Coefficient of Variation of Filament Diameter]

Warp yarns are extracted from a glass cloth, the diameter of the filaments constituting an arbitrary glass fiber is measured every 1 cm for 10 cm, and the average value thereof is taken as the average filament diameter. From the obtained measurement results, the coefficient of variation of the filament diameter is determined using the following formula.

$$\text{Coefficient of variation (\%) of filament diameter} = (\text{standard deviation of filament diameter}/\text{average filament diameter}) \times 100$$

[Measurement of Amount of Sodium Ions Contained in Water Used for Washing Before De-Oiling]

The amount of sodium ions contained in the water used to wash the glass cloth before heating de-oiling is measured using an ion chromatograph.

<Pre-Treatment Conditions>

Samples are prepared by appropriately diluting with water.

<Cation Ion Chromatography Conditions>

Device: Tosoh, IC-2010

Separation column: Tosoh, TSKgel-Super IC-Cation/P (4.6 mm×150 mm)

Separation liquid: 2.5 mM HNO3+0.5 mM L-histidine

Flow rate: 1.0 mL/min

Detection: electrical conductivity

Column temperature: 40° C.

Injection volume: 30 μL

[Measurement and Evaluation Method of Resin Impregnation Properties]

A glass cloth is sampled so as to achieve a size of 50 mm×50 mm. At this time, sampling is performed without bending or touching the measurement location. The number of voids when the sampled glass cloth is impregnated with castor oil (Product number: 03001535; manufactured by Hayashi Pure Chemical Ind., Ltd.) at a liquid temperature of 25° C. for a predetermined period of time is counted. A high-precision camera (frame size: 5120× 5120 pixels) is installed perpendicular to the glass cloth, both sides of the glass cloth are irradiated with LED lights (power flash bar lighting manufactured by CCS Inc.) as a light source from a position 15 cm away from the glass cloth and directly to the side thereof with the glass cloth sandwiched by the LED lights. At a viewing angle of 32 mm×32 mm, the number of voids of 160 μm or more present between the glass filaments is counted, and the average value of three measurements is taken as the number of voids.

Specifically, the "number of voids five minutes later when the glass cloth is impregnated with castor oil" is the number of voids observed when the glass cloth is impregnated with castor oil for 5 minutes under the above conditions.

The voids correspond to portions which are not impregnated with the matrix resin. Thus, the fact that the glass cloth has a small number of voids means that the glass cloth has excellent impregnating properties with the matrix resin.

[Production of Q1035 (Grey Cloth)]

Using glass yarns having an $SiO_2$ composition amount of more than 99.9% by mass, a cloth is woven using an air jet loom at a weaving density of 66 warp yarns/25 mm and 68 weft yarns/25 mm. It should be noted that weaving is performed so that the cloth width is 1300 mm. Silica glass yarns having an average filament diameter of 5.0 μm, a filament number of 100, and a twist number of 1.0 Z are used as the warp yarns. Silica glass yarns having an average filament diameter of 5.0 μm, a filament number of 100, and a twist number of 1.0 Z are used as the weft yarns.

[Production of Q1078 (Gray Cloth)]

Using glass yarns having an $SiO_2$ composition amount of more than 99.9% by mass, a cloth is woven using an air jet loom at a weaving density of 54 warp yarns/25 mm and 54 weft yarns/25 mm. It should be noted that weaving is performed so that the cloth width is 1300 mm. Silica glass yarns having an average filament diameter of 5.0 μm, a filament number of 200, and a twist number of 1.0 Z are used as the warp yarns. Silica glass yarns having an average filament diameter of 5.0 μm, a filament number of 200, and a twist number of 1.0 Z are used as the weft yarns.

[Production of Q1017 (Gray Cloth)]

Using glass yarns having an $SiO_2$ composition amount of more than 99.9% by mass, a cloth is woven using an air jet loom at a weaving density of 95 warp yarns/25 mm and 95 weft yarns/25 mm. It should be noted that weaving is performed so that the cloth width is 1300 mm. Silica glass yarns having an average filament diameter of 4.0 μm, a filament number of 50, and a twist number of 1.0 Z are used as the warp yarns. Silica glass yarns having an average filament diameter of 4.0 μm, a filament number of 50, and a twist number of 1.0 Z are used as the weft yarns.

Example 1

Sodium ions adhering to the glass surface were removed by washing while the obtained Q1035 gray cloth was transported at a line speed such that it was immersed in a water tank storing washing water 1 (sodium ion content=2 ppm) for 20 seconds (washing step before de-oiling). Thereafter, de-oiling was performed by heating at 800° C. for 15 seconds in a heating furnace provided on the same line (heating de-oiling step). Next, a treatment liquid was prepared by dispersing 0.3% by mass of 3-methacryloxypropyltrimethoxysilane (silane coupling agent A); Z6030 (manufactured by Dow Toray Industries, Inc.) in pure water adjusted to pH=3 with acetic acid. The cloth was immersed in the treatment liquid at a line tension of 200 N and a line speed of 30 m/min (surface treatment agent application step), squeezed to remove the liquid, and thereafter dried by heating at 130° C. for 60 seconds to fix the silane coupling agent (fixing step). The dried cloth was irradiated with ultrasonic waves with a frequency of 25 kHz and an output of 0.50 W/cm$^2$ in water to decrease the excess silane coupling agent physically adhered to the cloth (washing step), and then dried at 130° C. for 1 minute (drying step), whereby a glass cloth was obtained.

Example 2

A glass cloth was obtained in the same manner as in Example 1, except that the glass cloth was washed with washing water 2 (sodium ion content=10 ppm) and de-oiled by heating at 900° C. for 15 seconds.

Example 3

A glass cloth was obtained in the same manner as in Example 1, except that heating de-oiling was performed at 1000° C. for 15 seconds.

Example 4

A glass cloth was obtained in the same manner as in Example 3, except that a treatment liquid in which 0.15% by mass of 3-methacryloxypropyltrimethoxysilane (silane coupling agent A); Z6030 (manufactured by Dow Toray Industries, Inc.) and 0.40% by mass of 5-hexenyltrimethoxysilane (silane coupling agent B); Z6161 (manufactured by Dow Toray Industries, Inc.) were dispersed in pure water adjusted to pH=3 with acetic acid was used.

Example 5

A glass cloth was obtained in the same manner as in Example 1, except that heating de-oiling was performed at 1100° C. for 15 seconds, the line tension was changed to 130 N, and a treatment liquid in which 0.50% by mass of 5-hexenyltrimethoxysilane (silane coupling agent B); Z6161 (manufactured by Dow Toray Industries, Inc.) was dispersed was used to fix the silane coupling agent.

Example 6

Sodium ions adhering to the glass surface were removed by washing while the obtained Q1078 gray cloth was transported at a line speed such that it was immersed in a water tank storing washing water 1 (sodium ion content=2 ppm) for 20 seconds (washing step before de-oiling). Thereafter, de-oiling was performed by heating at 800° C. for 15 seconds in a heating furnace provided on the same line (heating de-oiling step). Next, a treatment liquid was prepared by dispersing 0.3% by mass of 3-methacryloxypropyltrimethoxysilane (silane coupling agent A); Z6030 (manufactured by Dow Toray Industries, Inc.) in pure water adjusted to pH=3 with acetic acid. The cloth was immersed in the treatment liquid at a line tension of 260 N and a line speed of 30 m/min (surface treatment agent application step), squeezed to remove the liquid, and thereafter dried by heating at 130° C. for 60 seconds to fix the silane coupling agent (fixing step). The dried cloth was irradiated with ultrasonic waves with a frequency of 25 kHz and an output of 0.50 W/cm$^2$ in water to decrease the excess silane coupling agent physically adhered to the cloth (washing step), and then dried at 130° C. for 1 minute (drying step), whereby a glass cloth was obtained.

Example 7

A glass cloth was obtained in the same manner as in Example 6, except that the glass cloth was washed with washing water 2 (sodium ion content=10 ppm) and heating de-oiling was performed at 1000° C. for 15 seconds.

Example 8

A glass cloth was obtained in the same manner as in Example 7, except that a treatment liquid in which 0.15% by mass of 3-methacryloxypropyltrimethoxysilane (silane coupling agent A); Z6030 (manufactured by Dow Toray Industries, Inc.) and 0.3% by mass of 5-hexenyltrimethoxysilane (silane coupling agent B); Z6161 (manufactured by Dow Toray Industries, Inc.) were dispersed in pure water adjusted to pH=3 with acetic acid was used to fix the silane coupling agent.

Example 9

A glass cloth was obtained in the same manner as in Example 6, except that heating de-oiling was performed at 1100° C. for 15 seconds.

Example 10

A glass cloth was obtained in the same manner as Example 6, except that heating de-oiling was performed at 1200° C. for 15 seconds, and the line tension was changed to 150 N.

Example 11

Sodium ions adhering to the glass surface were removed by washing while the obtained Q1017 gray cloth was transported at a line speed such that it was immersed in a water tank storing washing water 1 (sodium ion content=2 ppm) for 20 seconds (washing step before de-oiling). Thereafter, de-oiling was performed by heating at 1000° C. for 15 seconds in a heating furnace provided on the same line (heating de-oiling step). Next, a treatment liquid was prepared by dispersing 0.15% by mass of 3-methacryloxypropyltrimethoxysilane (silane coupling agent A); Z6030 (manufactured by Dow Toray Industries, Inc.) and 0.3% by mass of 5-hexenyltrimethoxysilane (silane coupling agent B); Z6161 (manufactured by Dow Toray Industries, Inc.) were dispersed in pure water adjusted to pH=3 with acetic acid. The cloth was immersed in the treatment liquid at a line tension of 150 N and a line speed of 30 m/min (surface treatment agent application step), squeezed to remove the liquid, and thereafter dried by heating at 130° C. for 60 seconds to fix the silane coupling agent (fixing step). The dried cloth was irradiated with ultrasonic waves with a frequency of 25 kHz and an output of 0.50 $W/cm^2$ in water to decrease the excess silane coupling agent physically adhered to the cloth (washing step), and then dried at 130° C. for 1 minute (drying step), whereby a glass cloth was obtained.

Example 12

A glass cloth was obtained in the same manner as in Example 1, except that the glass cloth, which had been ultrasonically washed to decrease the excess silane coupling agent, was subjected to a fiber-opening treatment by uniformly spraying dry ice fine particles of 5 to 50 μm over the entire glass cloth at an air pressure of 0.4 MPa.

Example 13

A glass cloth was obtained in the same manner as in Example 6, except that the glass cloth, which had been ultrasonically washed to decrease the excess silane coupling agent, was subjected to a fiber-opening treatment by uniformly spraying dry ice fine particles of 5 to 50 μm over the entire glass cloth at an air pressure of 0.45 MPa.

Comparative Example 1

A glass cloth was obtained in the same manner as in Example 1, except that washing water 3 (sodium ion content=24 ppm) was used in the washing step before de-oiling and the line tension was changed to 60 N. Because the tension was low, the glass cloth flapped significantly during transportation, whereby wrinkling and scratching due to contact with the drying oven were visually observed on the glass cloth during the step of fixing the treatment liquid.

Comparative Example 2

A glass cloth was obtained in the same manner as in Comparative Example 1, except that the heating de-oiling was performed at 1000° C. for 15 seconds and the line tension was changed to 90 N. Because the tension was low, the glass cloth flapped significantly during transportation, whereby wrinkling and scratching due to contact with the drying oven were visually observed on the glass cloth during the step of fixing the treatment liquid.

Comparative Example 3

An attempt was made to process a glass cloth in the same manner as in Comparative Example 2, except that the line tension was changed to 130 N. However, because the ratio of the tensile strength of glass cloth to the line tension (tensile strength of glass cloth (warp direction)/line tension) was low, the glass cloth became torn during the step of fixing the silane coupling agent, whereby a glass cloth could not be obtained.

Comparative Example 4

A glass cloth was obtained in the same manner as in Example 7, except that washing water 3 (sodium ion content=24 ppm) was used in the washing step before de-oiling and the line tension was changed to 80 N. Because the tension was low, the glass cloth flapped significantly during transportation, whereby wrinkling and scratching due to contact with the drying oven were visually observed on the glass cloth during the step of fixing the treatment liquid.

Comparative Example 5

The attempt was made to process a glass cloth in the same manner as in Comparative Example 4, except that the line tension was changed to 150 N. However, because the ratio of the tensile strength of glass cloth to the line tension (tensile strength of glass cloth (warp direction)/line tension) was low, the glass cloth became torn during the step of fixing the silane coupling agent, whereby a glass cloth could not be obtained.

Comparative Example 6

A glass cloth was obtained in the same manner as in Example 4, except that heating de-oiling was performed at 350° C. for 10 hours, the line tension was set to 200 N, and the washing water 2 was used. Though no wrinkling or scratching were observed in the obtained glass cloth, the dissipation factor of the glass cloth was high because the temperature of the heating de-oiling was low.

[Glass Cloth Appearance Inspection Method]

The glass cloths of the Examples and Comparative Examples described above were each placed on a Roll-to-Roll inspection table, and while applying thereto a tension of 100 N/1300 mm and irradiating with a halogen lamp, visual inspection was conducted every 1 m of the product to observe whether there was wrinkling, scratching, or tearing on the glass cloth. Defects per 2000 m of each product were counted. Product portions in which the appearance defects occurred in one or more locations per m of each product were defined as defects, and product portions in which no appearance defects occurred in any locations per m of each product were defined as non-defects. Based on the inspection results, the glass cloths of the Examples and Comparative Examples were graded according to the following criteria.

Wrinkling

- A: The total of product portions with wrinkling was less than 101 m (=the incidence of defects was less than 5%)
- B: The total of product portions with wrinkling was 101 m or more and less than 200 m (=the incidence of defects was 5% or more and less than 10%)
- C: The total of product portions with wrinkling was 200 m or more (=the incidence of defects was 10% or more)

Scratching

- A: The total of product portions with scratching was less than 101 m (=the incidence of defects was less than 5%)
- B: The total of product portions with scratching was 101 m or more and less than 200 m (=the incidence of defects was 5% or more and less than 10%)
- C: The total of product portions with scratching was 200 m or more (=the incidence of defects was 10% or more)

Tearing

- A: The total of product portions where the cloth became torn was less than 7 m (the incidence of defects was less than 0.3%)
- B: The total of product portions where the cloth became torn was 7 m or more and less than 12 m (the incidence of defects was 0.3% or more and less than 0.6%)
- C: The total of the product portions where the cloth became torn was 12 m or more (the incidence of defects was 0.6% or more)

The production conditions and evaluation results of the Examples and Comparative Examples are shown in the tables below. It should be noted that prepregs, printed circuit boards, integrated circuits, and electronic devices could be produced by a conventional method using the glass cloths of the Examples.

[Method for Production of Laminate]

A varnish was prepared by adding 45 parts by mass of polyphenylene ether (manufactured by SABIC, Noryl SA9000), 10 parts by mass of triallylisocyanurate, 45 parts by mass of toluene, and 0.6 parts by mass of 1,3-di(tert-butylisopropylbenzene) to a stainless-steel container and stirring at room temperature for 1 hour. The glass cloth obtained in each of Examples 1, 6, 12, and 13 was impregnated with the prepared varnish and then dried at 115° C. for 1 minute to obtain prepregs. The obtained prepregs were stacked, and copper foils having a thickness of 12 μm were stacked on the top and bottom thereof, and the stack was heated and pressed at 200° C. and 40 kg/cm$^2$ for 120 minutes to obtain a laminate having a thickness of 1 mm.

[Method for Evaluating Insulation Reliability of Laminate]

A wiring pattern having through holes arranged at intervals of 0.30 mm was prepared on the copper foil on both sides of the laminate obtained as described above to obtain an insulation reliability evaluation sample. A voltage of 50 V was applied to the obtained sample in the atmosphere at a temperature of 85° C. and a humidity of 85% RH, and the change in resistance value was measured. At this time, the case where the resistance became less than 1 MΩ within 500 hours after the start of the test was counted as an insulation failure. The same measurements were performed on 10 samples, and among the 10 samples, the number of samples that did not suffer from insulation defects was determined.

TABLE 1

| | | | Ex 1 | Ex 2 | Ex 3 | Ex 4 | Ex 5 |
|---|---|---|---|---|---|---|---|
| Style | — | — | Q1035 | Q1035 | Q1035 | Q1035 | Q1035 |
| Washing before de-oiling conditions | Washing water | — | Washing water 1 | Washing water 2 | Washing water 1 | Washing water 1 | Washing water 1 |
| | Sodium content | ppm | 2 | 10 | 2 | 2 | 2 |
| | Immersion time | sec | 20 | 20 | 20 | 20 | 20 |
| Heating de-oiling conditions | Temperature | ° C. | 800 | 900 | 1000 | 1000 | 1100 |
| | Heating time | sec | 15 | 15 | 15 | 15 | 15 |
| Surface treatment agent application conditions | Transportation speed | m/min | 30 | 30 | 30 | 30 | 30 |
| | Tension | N | 200 | 200 | 200 | 200 | 130 |
| | Silane coupling agent | — | A | A | A | A + B | B |
| Glass cloth physical properties | Thickness | μm | 34 | 34 | 34 | 34 | 34 |
| | Tensile strength (warp direction) | N/25 mm | 71 | 64 | 59 | 55 | 20 |
| | Coefficient of variation of tensile strength (warp direction) | % | 1 | 3 | 4 | 2 | 7 |
| | Coefficient of variation of filament diameter | % | 3 | 4 | 2 | 2 | 3 |
| | Tensile strength/thickness | N/25 mm/μm | 2.09 | 1.88 | 1.74 | 1.62 | 0.59 |
| | Dissipation factor @ 10 GHz | — | 0.00031 | 0.00030 | 0.00029 | 0.00044 | 0.00038 |
| | Loss-on-ignition value | wt % | 0.108 | 0.099 | 0.113 | 0.173 | 0.172 |
| | Basis weight | g/m$^2$ | 25.5 | 25.6 | 25.7 | 25.5 | 25.2 |
| | Coefficient of variation of basis weight | % | 0.8 | 1.0 | 0.8 | 0.9 | 0.8 |
| Bulk physical properties of glass | Dissipation factor @ 10 GHz | — | 0.0001 | 0.0001 | 0.0001 | 0.0001 | 0.0001 |
| Appearance Defects | Wrinkling | — | A | A | A | A | B |
| | Scratching | — | A | A | A | A | B |
| | Tearing | — | A | A | A | A | A |

TABLE 2

| | | | Ex 6 | Ex 7 | Ex 8 | Ex 9 |
|---|---|---|---|---|---|---|
| Style | — | — | Q1078 | Q1078 | Q1078 | Q1078 |
| Washing before de-oiling conditions | Washing water | — | Washing water 1 | Washing water 2 | Washing water 1 | Washing water 1 |
| | Sodium content | ppm | 2 | 10 | 2 | 2 |
| | Immersion time | sec | 20 | 20 | 20 | 20 |
| Heating de-oiling conditions | Temperature | ° C. | 800 | 1000 | 1000 | 1100 |
| | Heating time | sec | 15 | 15 | 15 | 15 |
| Surface treatment agent application conditions | Transportation speed | m/min | 30 | 30 | 30 | 30 |
| | Tension | N | 260 | 260 | 260 | 260 |
| | Silane coupling agent | — | A | A | A + B | A |
| Glass cloth physical properties | Thickness | μm | 47 | 47 | 47 | 47 |
| | Tensile strength (warp direction) | N/25 mm | 112 | 98 | 104 | 87 |
| | Coefficient of variation of tensile strength (warp direction) | % | 2.38 | 2.09 | 2.21 | 1.85 |
| | Coefficient of variation of filament diameter | % | 2 | 1 | 1 | 2 |
| | Tensile strength/thickness | N/25 mm/μm | 3 | 2 | 4 | 2 |
| | Dissipation factor @ 10 GHz | — | 0.00030 | 0.00028 | 0.00040 | 0.00026 |
| | Loss-on-ignition value | wt % | 0.098 | 0.106 | 0.154 | 0.102 |
| | Basis weight | g/m$^2$ | 40.3 | 40.4 | 40.4 | 40.3 |

TABLE 2-continued

| | | | | | | |
|---|---|---|---|---|---|---|
| | Coefficient of variation of basis weight | % | 0.9 | 1.0 | 0.8 | 0.9 |
| Bulk physical properties of glass | Dissipation factor @ 10 GHz | — | 0.0001 | 0.0001 | 0.0001 | 0.0001 |
| Appearance Defects | Wrinkling | — | A | A | A | A |
| | Scratching | — | A | A | A | A |
| | Tearing | — | A | A | A | A |

| | | | Ex 10 | Ex 11 | Ex 12 | Ex 13 |
|---|---|---|---|---|---|---|
| Style | — | — | Q1078 | Q1017 | Q1035 | Q1078 |
| Washing before de-oiling conditions | Washing water | — | Washing water 1 | Washing water 1 | Washing water 1 | Washing water 1 |
| | Sodium content | ppm | 2 | 2 | 2 | 2 |
| | Immersion time | sec | 20 | 20 | 20 | 20 |
| Heating de-oiling conditions | Temperature | ° C. | 1200 | 1000 | 800 | 800 |
| | Heating time | sec | 15 | 15 | 15 | 15 |
| Surface treatment agent application conditions | Transportation speed | m/min | 30 | 30 | 30 | 30 |
| | Tension | N | 150 | 150 | 200 | 260 |
| | Silane coupling agent | — | A | A + B | A | A |
| Glass cloth physical properties | Thickness | μm | 47 | 15 | 34 | 47 |
| | Tensile strength (warp direction) | N/25 mm | 25 | 42 | 70 | 115 |
| | Coefficient of variation of tensile strength (warp direction) | % | 0.53 | 2.80 | 2.06 | 2.45 |
| | Coefficient of variation of filament diameter | % | 10 | 5 | 2 | 3 |
| | Tensile strength/thickness | N/25 mm/μm | 3 | 2 | 3 | 2 |
| | Dissipation factor @ 10 GHz | — | 0.00025 | 0.00038 | 0.00031 | 0.00030 |
| | Loss-on-ignition value | wt % | 0.102 | 0.149 | 0.108 | 0.098 |
| | Basis weight | g/m$^2$ | 40.4 | 10.5 | 25.5 | 40.3 |
| | Coefficient of variation of basis weight | % | 0.8 | 1.4 | 0.8 | 0.9 |
| Bulk physical properties of glass | Dissipation factor @ 10 GHz | — | 0.0001 | 0.0001 | 0.0001 | 0.0001 |
| Appearance Defects | Wrinkling | — | B | A | A | A |
| | Scratching | — | B | A | A | A |
| | Tearing | — | A | A | A | A |

TABLE 3

| | | | Comp Ex 1 | Comp Ex 2 | Comp Ex 3 | Comp Ex 4 | Comp Ex 5 | Comp Ex 6 |
|---|---|---|---|---|---|---|---|---|
| Style | — | — | Q1035 | Q1035 | Q1035 | Q1078 | Q1078 | Q1035 |
| Washing before de-oiling conditions | Washing water | — | Washing water 3 | Washing water 3 | Washing water 3 | Washing water 3 | Washing water 3 | Washing water 3 |
| | Sodium content | ppm | 24 | 24 | 24 | 24 | 24 | 24 |
| | Immersion time | sec | 20 | 20 | 20 | 20 | 20 | 20 |
| Heating de-oiling conditions | Temperature | ° C. | 800 | 1000 | 1000 | 1000 | 1000 | 350 |
| | Heating time | sec | 15 | 15 | 15 | 15 | 15 | 10 hr |
| Surface treatment agent application conditions | Transportation speed | m/min | 30 | 30 | 30 | 30 | 30 | 30 |
| | Tension | N | 60 | 90 | 130 | 80 | 150 | 200 |
| | Silane coupling agent | — | A | A | A | A | A | A + B |
| Glass cloth physical properties | Thickness | μm | 34 | 34 | 34 | 47 | 47 | 34 |
| | Tensile strength (warp direction) | N/25 mm | 13 | 16 | 16 | 15 | 15 | 75 |
| | Coefficient of variation of tensile strength (warp direction) | % | 0.38 | 0.47 | 0.47 | 0.32 | 0.32 | 2.21 |
| | Coefficient of variation of filament diameter | % | 11 | 12 | 14 | 13 | 13 | 3 |
| | Tensile strength/thickness | N/25 mm/μm | 3 | 4 | 2 | 3 | 5 | 4 |
| | Dissipation factor @ 10 GHz | — | 0.00031 | 0.00028 | No samples which could be evaluated could be obtained | 0.00029 | No samples which could be evaluated could be obtained | 0.00116 |
| | Loss-on-ignition value | wt % | 0.104 | 0.102 | | 0.105 | | 0.174 |
| | Basis weight | g/m$^2$ | 25.4 | 25.3 | | 40.5 | | 25.3 |
| | Coefficient of variation of basis weight | % | 0.9 | 0.8 | | 0.8 | | 0.9 |
| Bulk physical properties of glass | Dissipation factor @ 10 GHz | — | 0.0001 | 0.0001 | 0.0001 | 0.0001 | 0.0001 | 0.0001 |
| Appearance Defects | Wrinkling | — | C | C | — | C | — | A |
| | Scratching | — | C | C | — | C | — | A |
| | Tearing | — | B | B | — | B | — | A |

TABLE 4

| | Ex 1 | Ex 6 | Ex 12 | Ex 13 |
|---|---|---|---|---|
| Number of voids five minutes later | 198 | 200 | 110 | 100 |
| Insulation reliability of laminate substrate | 3 | 3 | 9 | 9 |

The invention claimed is:

1. A glass cloth, comprising woven glass yarns each containing a plurality of filaments, wherein a bulk dissipation factor of a glass in the glass yarns is 0.0010 or less, a tensile strength of warp yarns per thickness of the glass cloth as represented by the following formula (A) is in the range of 0.50 to 6.0:

$$\text{warp direction tensile strength}\,(N/25\text{ mm})\text{ of the glass cloth/thickness }(\mu\text{m})\text{ of the glass cloth,} \tag{A}$$

a coefficient of variation of the warp direction tensile strength of the glass cloth is in the range of 15% or less, and a dissipation factor of the glass cloth at 10 GHz is in the range of greater than 0 and 0.0010 or less.

2. A glass cloth, comprising woven glass yarns each containing a plurality of filaments, wherein a bulk dissipation factor of a glass in the glass yarns is 0.0010 or less, a tensile strength of warp yarns per thickness of the glass cloth as represented by the following formula (A) is in the range of 0.50 to 6.0:

$$\text{warp direction tensile strength}\,(N/25\text{ mm})\text{ of the glass cloth/thickness }(\mu\text{m})\text{ of the glass cloth,} \tag{A}$$

a coefficient of variation of a filament diameter of glass fibers constituting the glass cloth is in the range of 10% or less, and a dissipation factor of the glass cloth at 10 GHz is in the range of greater than 0 and 0.0010 or less.

3. The glass cloth according to claim 1, wherein the dissipation factor of the glass cloth at 10 GHz is in the range of greater than 0 and 0.0055 or less.

4. The glass cloth according to claim 1, wherein a silicon (Si) content of the glass yarns is 95.0% by mass to 100% by mass in terms of silicon dioxide ($SiO_2$).

5. The glass cloth according to claim 1, wherein the glass yarns are treated with a surface treatment agent containing a silane coupling agent.

6. The glass cloth according to claim 5, wherein the surface treatment agent contains a silane coupling agent having a structure represented by the following general formula (1):

$$X(R)_{3-n}SiY_n \tag{1}$$

where X is an organic functional group having at least one selected from: an amino group; and a radical-reactive unsaturated double bond group, each Y is independently an alkoxy group, n is an integer from 1 to 3, and each R is independently a group selected from the group consisting of a methyl group, an ethyl group, and a phenyl group.

7. The glass cloth according to claim 6, wherein X in formula (1) is an organic functional group which is not in a form of a salt with an ionic compound.

8. The glass cloth according to claim 6, wherein X in formula (1) does not contain an amine or an ammonium cation.

9. The glass cloth according to claim 6, wherein X in formula (1) is an organic functional group having one or more methacryloxy groups or acryloxy groups.

10. The glass cloth according to claim 1, wherein a loss on ignition value of the glass cloth is 0.01% by mass or more and less than 0.18% by mass.

11. The glass cloth according to claim 1, wherein a dissipation factor of the glass cloth at 10 GHz is in the range of 0.00050 or less.

12. The glass cloth according to claim 1, wherein a thickness of the glass cloth is 60 μm or less.

13. The glass cloth according to claim 1, wherein a coefficient of variation of the basis weight (g/m2) of the glass cloth is 3% or less.

14. The glass cloth according to claim 1, wherein a coefficient of variation of the basis weight (g/$m^2$) of the glass cloth is 1.5% or less.

15. The glass cloth according to claim 1, wherein a number of voids contained in the glass cloth after being impregnated with castor oil at 25° C. for five minutes is 180 or less when observed by irradiating LED lights from a position 15 cm away from the glass cloth and directly to both sides of the glass cloth so that the glass cloth is sandwiched by the LED lights.

16. The glass cloth according to claim 1, for printed circuit boards.

17. A prepreg, comprising the glass cloth according to claim 1, a thermosetting resin, and an inorganic filler.

18. A printed circuit board, comprising the prepreg according to claim 17.

19. An integrated circuit, comprising the printed circuit board according to claim 18.

20. An electronic device, comprising the printed circuit board according to claim 18.

* * * * *